(12) United States Patent
Smith

(10) Patent No.: US 6,239,671 B1
(45) Date of Patent: May 29, 2001

(54) TRANSMISSION OR DELAY LINE TRANSFORMERS

(75) Inventor: Paul Smith, Oxford (GB)

(73) Assignee: Isis Innovation Limited, Oxford (GB)

( * ) Notice: Subject to any disclaimer, the term of this patent is extended or adjusted under 35 U.S.C. 154(b) by 0 days.

(21) Appl. No.: 09/214,942

(22) PCT Filed: Jul. 10, 1997

(86) PCT No.: PCT/GB97/01866

§ 371 Date: May 18, 1999

§ 102(e) Date: May 18, 1999

(87) PCT Pub. No.: WO98/04039

PCT Pub. Date: Jan. 29, 1998

(30) Foreign Application Priority Data

Jul. 19, 1996 (GB) .................................................. 9615179
Mar. 5, 1997 (GB) .................................................. 9704557

(51) Int. Cl.[7] ........................................................ H03H 7/38
(52) U.S. Cl. ............................ 333/35; 333/156; 333/236
(58) Field of Search .................................. 333/1, 33, 35, 333/24 R, 156, 160, 236, 24

(56) References Cited

U.S. PATENT DOCUMENTS

| 3,132,313 | 5/1964 | Alford | 333/32 |
|---|---|---|---|
| 3,370,257 | 2/1968 | Spierling | 333/33 |
| 3,731,237 | * 5/1973 | Beurrier | 333/24 |
| 4,689,593 | * 8/1987 | Richardson | 336/90 |
| 5,130,678 | * 7/1992 | Edwards | 333/24 |

* cited by examiner

Primary Examiner—Benny Lee
Assistant Examiner—Kimberly Glenn
(74) Attorney, Agent, or Firm—Volpe and Koenig, P.C.

(57) ABSTRACT

A transmission or delay line transformer comprising a plurality of transmission or delay lines (101–110) so arranged that the inputs to the lines are connected together in parallel to provide a transformer input (130) and the outputs of the lines are connected together in series so as to provide a transformer output (131). In order to provide isolation between the input (130) and the output (131) of the transformer the lines are arranged so as to provide inductive isolation (L) between the inputs and outputs of the lines. The inductive isolation (L) provided between the input and output of any particular line depends upon the stage of the transformer which that particular line forms, the higher the stage the higher the amount of inductive isolation provided. The transmission or delay lines may take the form of conventional transmission lines, transmission lines modified so as to increase the time of propagation of signals along the line or lumped element balanced delay lines.

12 Claims, 12 Drawing Sheets

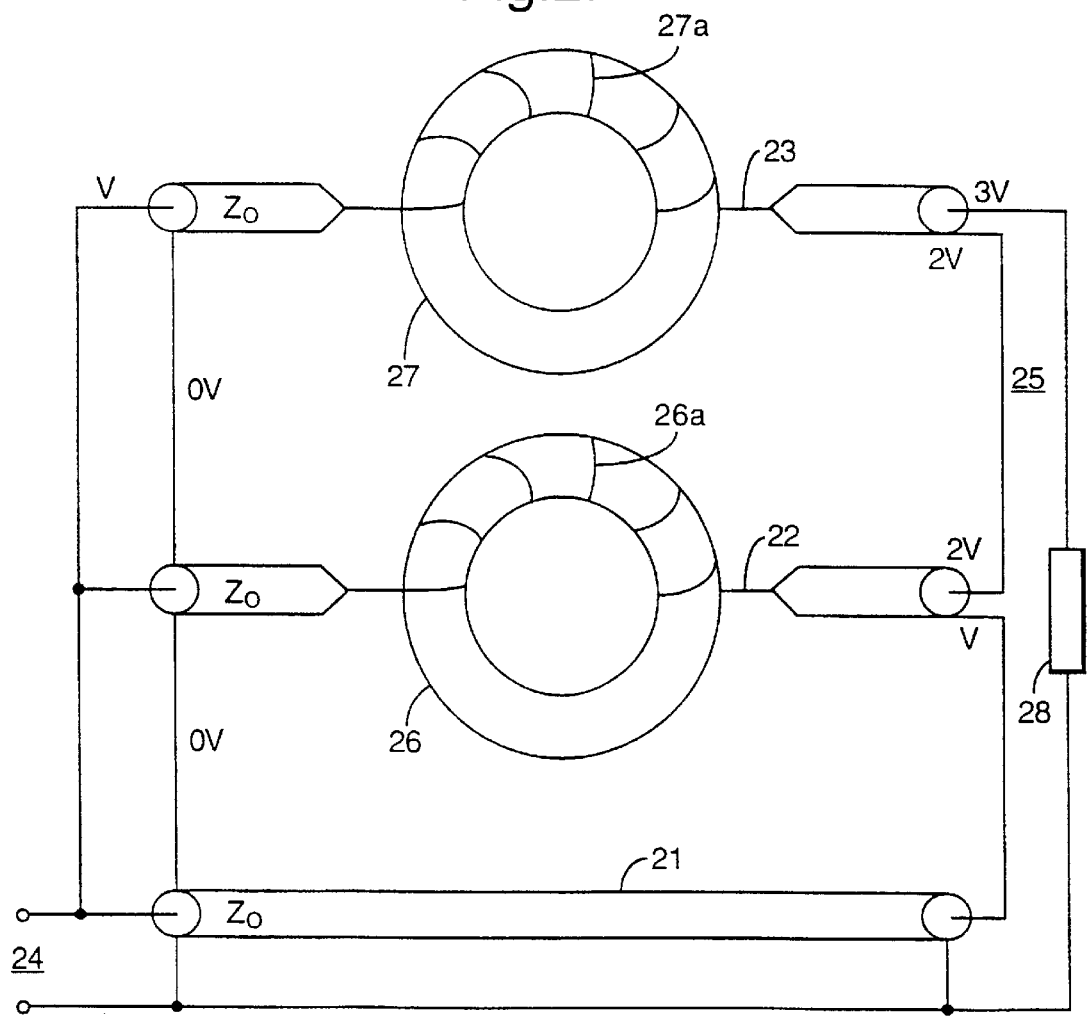

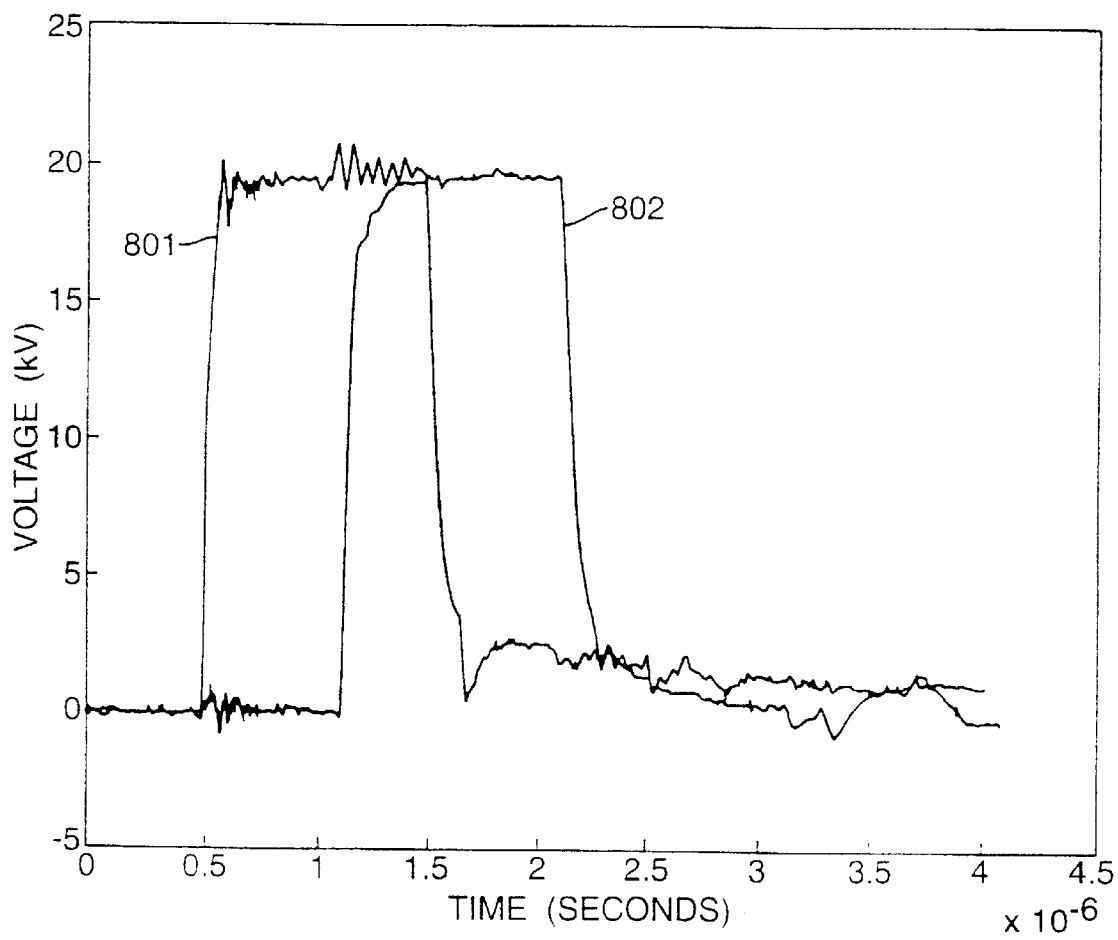

TRANSMISSION OR DELAY LINE TRANSFORMERS

The present invention relates to transmission or delay line transformers.

Although transmission line transformers are known and have been used in the past in a limited range of applications, there has not in the past been any real understanding of the manner in which these devices operate. Furthermore, no method of modelling the behaviour of the devices so as to be able to accurately predict the performance of a particular design of transformer or how the design should be altered to improve its performance characteristics has previously been described.

The present invention seeks to provide a family of transmission or delay line transformers which may be adapted for use in a wide range of applications so as to have good performance characteristics at lower frequencies than has hereto been possible, and a method of designing the same.

According to a first aspect of the present invention there is provided a transformer comprising a plurality of transmission or delay lines so arranged as to provide an input to, and an output from the transformer, wherein isolation between the input and the output is achieved principally by way of inductive impedance.

Preferably, the inductive impedances of the lines are not all equal, but differ from one another in a predetermined manner.

Preferably, the isolation between the input and the output is enhanced by mutual inductive impedance between the lines.

Preferably, capacitance reducing means is provided for reducing stray capacitance between the transmission or delay lines of the transformer. In this way, the high frequency response of the transformer may be enhanced. In some embodiments of the present invention, the capacitance reducing means may take the form of a substantially air filled material, such as expanded polystyrene, located between coils of adjacent, or nearly adjacent, transmission or delay lines.

According to one preferred embodiment of the present invention, the transformer comprises a plurality of balanced delay lines. By balanced delay line, it is meant that both conductors (e.g. inner and outer conductors in the case of a co-axial cable) have an associated inductance. Preferably, the inductance is shared equally between both conductors of each delay line.

Each delay line may take the form of a lumped element delay line comprising a plurality of inductors and capacitors. In this form, the high frequency response of the transformer may be enhanced by increasing the number of LC sections of each delay line without increasing the total desired inductance or capacitance of the delay line. Thus, in certain preferred embodiments of the present invention, there is provided a transformer comprising a large number of lumped element LC sections each having a relatively low impedance and capacitance compared with the total inductance and capacitance of the delay line. Preferably, there are provided at least 10 LC sections.

Alternatively, each delay line could simply comprise a continuous transmission line adapted or modified to have slow signal transmission characteristics. This may be achieved for example by increasing the permittivity or permeability of the insulating material between the first and second conductors of each delay line, or by increasing the length of one or both of the conductors (e.g. by helically winding the outer conductor), or by a combination of such known techniques.

According to a further preferred embodiment of the present invention, there is provided a multi-stage transformer comprising a plurality of transmission or delay lines, the transformer having a lower stage and a higher stage and optionally having intermediate stages in between, each stage of the transformer being formed from one of said plurality of lines such that there are as many lines as stages of the transformer, each line comprising a first and a second conductor which may conveniently be arranged as a co-axial cable Where the transmission or delay lines take the form of a lumped element delay line, the first and second conductors are formed by a number of inductors connected together in series with a plurality of capacitors connected between the first and second conductors of each line.

At a first or input end of each of the lines, an input to the transformer is formed by electrically connecting the first conductors of the lines to a first input terminal and separately electrically connecting the second conductors of the lines to a second input terminal, whereby an input signal across the first and second input terminals is applied, in parallel, across the first and second conductors of each line At the second or output end of each of the lines, an output to the transformer is formed by connecting the lines together in series (i.e. by connecting the first conductor of one line to the second conductor of an adjacent line) such that the output voltage is equal to the sum of the voltages across the first and second conductors of each line at its second or output end.

Of course, the transformer could be used as a current gain transformer simply by reversing the transformer such that the input terminals become the output terminals and the output terminals become input terminals, in just the same way as one would with a conventional transformer. Similarly, the transformer could be used as an inverting transformer by reversing the polarity of the output terminals (again, this is entirely analagous to how one would proceed to form a conventional inverting transformer).

In some preferred embodiments of the present invention, the transformer further comprises at least one magnetic core, which may, for example, be made of ferrite material, about which at least one of the transmission lines is wound to provide said inductive impedance between the input to and output from the transformer. The advantage of this is that it enables the transformer to be used at relatively low frequencies and reduces pulse droop if used in a pulsed mode.

Preferably the inductive isolation between the input and the output is greatest at the highest stage of the transformer. Conveniently this may be achieved by increasing the inductive isolation at each stage of the transformer relative to each stage's nearest lower neighbour. In some applications, it is also preferable to maintain stray capacitance associated with the inductive windings, especially at the top of the transformer, as low as possible by for instance introducing an air gap between the transmission lines. It is also convenient, when constructing an n-stage transformer according to the present invention, for the transformer to comprise n transmission or delay lines and (n−1) ferrite cores, wherein each line forms a stage of the transformer and wherein successive lines are wound around an increasing number of the ferrite cores, the first line not being wound around any of the ferrite cores and the last line being wound successively around all of the ferrite cores.

According to a second aspect of the present invention, there is provided a method of constructing a transmission or delay line transformer comprising the steps of:

providing a basic design of a transformer comprising a plurality of transmission or delay lines arranged so as to provide inductive isolation between an input and an output of the transformer;

expressing the design in terms of an unsimplified equivalent circuit in which elements of the design and stray capacitances, inductances and resistances are represented by idealised components;

reexpressing said equivalent circuit in a simplified form by "reflecting" the idealised components of a primary circuit (referred to the input of the transformer) to a secondary circuit (referred to the output of the transformer), or vice versa, by multiplying, or dividing, the value of their impedances by a factor equal to the square of the stage number of the transformer to which the components are connected so as to produce a simplified equivalent circuit, which also includes idealised components, from the point of view of the output, or the input of the transformer;

analysing the theoretical performance of the simplified equivalent circuit for the output, or input, signals;

adjusting the values of the capacitance, inductance and resistance of the idealised components of the simplified equivalent circuit until a suitable theoretical performance for the output, or input, signal is achieved;

evaluating the required characteristics of the idealised components of the unsimplified equivalent circuit; and constructing a transformer whose characteristics substantially correspond to the characteristics of the idealised components of the unsimplified equivalent circuit.

The term "reflecting" is well known in the art of transformers and it is used in the present context to have an analogous meaning, except that the stage numbers of the transformer are used in place of the ratio of turns in the secondary to the primary coils.

A further feature of the present invention results from the observation that "parasitic transmission lines" are formed when the transmission or delay lines are connected together in parallel at their inputs and in series at their outputs as described above. The parasitic transmission lines are essentially formed either between the ground plane and one of the first or second conductors of the actual transmission or delay lines, or between conductors of adjacent actual transmission or delay lines. At least some of the parasitic transmission lines are shorted at the input end of the transformer and cause inverted signals appearing at the output of the transformer to be reflected from the shorted end of the parasitic transmission lines back to the output of the transformer. The effect of these unwanted reflections is essentially to cause pulse droop of the transformer when used as a pulse transformer, and to reduce the low frequency response of the transformer when used as a power or voltage transformer.

Thus, transformers in accordance with the present invention preferably further comprise means for reducing the transfer of energy between actual and parasitic lines in the transformer. Such means may involve means for increasing the typical transmission time of the parasitic lines (by for instance increasing the length of conductors which partially form the parasitic lines or by increasing the permittivity or permeability of material between the conductors which form the parasitic lines) and/or means for reducing the transmission of energy into the parasitic lines by for example increasing the characteristic impedance of the parasitic lines (which may be achieved, for example, by increasing the spacing between the conductors which form parasitic lines) or by reducing the characteristic impedance of the actual transmission or delay lines. Reduction of the characteristic impedance of the actual transmission or delay lines may be achieved by maximising the distributed or total capacitance between the first and second conductors of each actual transmission or delay line by, for example, reducing the spacing between the first and second conductors and/or increasing the permittivity of the dielectric material between them.

Transformers constructed in accordance with the present invention are particularly advantageous over known transformers because they are able to operate as voltage, current, power, isolation or impedance matching transformers efficiently over a very large bandwidth, such that they can be used advantageously as pulse transformers or as power transformers. This very wide range of applications and useful frequencies is as a result of finding an accurate modelling method for transmission line transformers, which modelling method has enabled the winding technique of a preferred embodiment of the present invention described in greater detail below, to be developed.

In order that the present invention may be better understood embodiments thereof will now be described by way of example only and with reference to the accompanying drawings in which;

FIG. 1b is a circuit diagram of an equivalent circuit of the two-stage voltage transformer of FIG. 1a;

FIG. 2 is a diagrammatical sketch of a three-stage voltage transformer;

FIG. 4b is a circuit diagram of a simplified equivalent circuit, referred to the primary circuit of the four-stage voltage transformer of FIG. 4a;

FIG. 5b is a circuit diagram of an equivalent circuit of FIG. 5a;

FIG. 7b is similar to FIG. 7a but shows a 100 micro second input pulse as opposed to the 1 micro second input pulse of FIG. 7a;

FIG. 8 is a graph showing input and output waveforms of the transformer of FIG. 6 at full operating voltage;

Referring firstly to FIGS. 1–5 a new type of modelling of transmission line transformers, which enables an improved method of constructing transmission line transformers having a wide range of applications, is described.

In order to model this type of transformer an entirely different approach must be taken to that used for linear transformers and it is shown that a transformer model can be established which is, in many ways, analogous to the lumped element model used to analyse the performance of conventional pulse transformers wound on a magnetic core. The model presented allows the designer of such devices to work out where inductive isolation should be put, how much isolation is required at each stage of a transformer to achieve acceptable pulse droop, and the benefits of using mutually coupled isolation windings rather than separated windings on individual cores. The model also shows what needs to be done to minimise pulse rise-time and allows the designer to assess reliably, when magnetic cores are used for inductive isolation, the size and type of core to be used for optimum performance. From the model it is clear that the performance of a properly engineered transformer can easily exceed that of conventionally wound pulse transformers, particularly in minimising pulse-shape distortion and maximising gain-band-width response.

It is assumed throughout that the voltage transmission line transformers to be described are constructed from lengths of standard coaxial cable transmission line and that inductive isolation is provided by winding the lines on toroidal ferrite cores, except where otherwise stated. There is no reason why other types of transmission line or magnetic cores should not be used, the choice is subject only to practical or other physical constraints. It is also important, prior to discussing these transformers, to define the term n-stage transformer as distinct to the number of lines used to construct a given device. An n-stage transformer here is a device in which each stage contributes a single multiple of the input voltage to the output voltage of the transformer i.e. an n-stage transformer has an ideal voltage gain of n. In most cases the number of stages is equal to the number of lines used to build a given transformer. However it is quite possible, for example, to build transformers with quite low output impedances by connecting a number of transmission lines in parallel at each stage of the transformer. Clearly in such transformers the number of transmission lines used to build the transformer will not be equal to the number of stages as defined above.

Figure 1A:
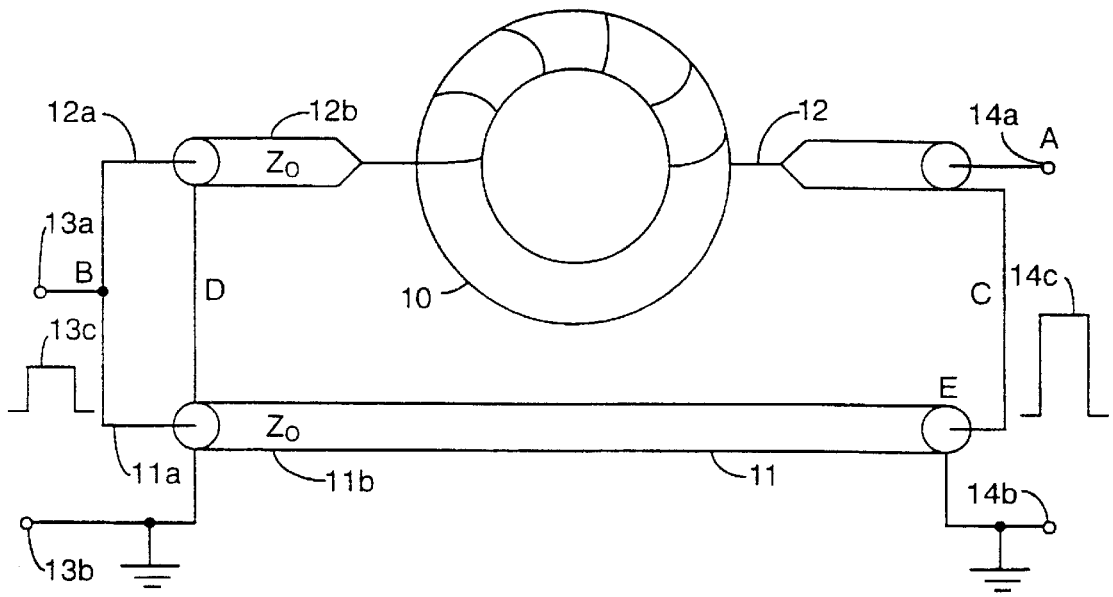
FIG. 1a is a diagrammatical sketch of a two-stage voltage transformer.
Figure 1B:
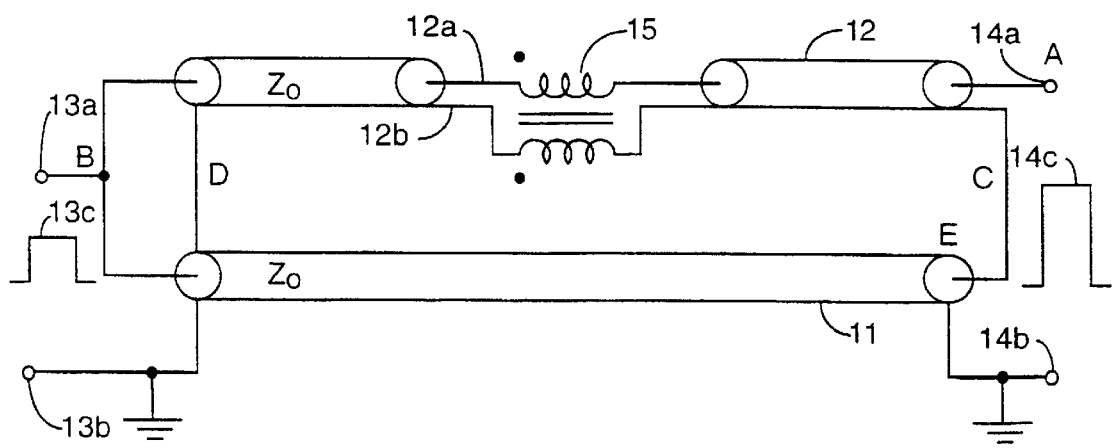

FIG. 1a gives a simple diagram of a 2-stage voltage transformer in which inductive isolation is provided by winding the top stage of the transformer on a toroidal magnetic core 10. The connection of first 11 and second 12 lines having inner 11a, 12a and outer 11b, 12b conductors respectively, used to make the transformer is standard as the lines are connected in parallel at the input to the transformer, formed by input terminals 13a, 13b, and in series at the output, formed by output terminals 14a, 14b, and the lines 11, 12 are of equal physical length. Ideally such a transformer would have a voltage gain of 2 as, in this case, the number of stages and lines are equal. An electrical equivalent circuit of the arrangement is given in FIG. 1b in which the effect of the inductive winding is represented as a 1:1 transformer 15 connected in parallel with the inner 12a and outer 12b conductors of the second line 12 at the centre of the line. The purpose of the winding can be seen by reference to both FIGS. 1a and 1b. Without the winding it is apparent that there would be two short circuit paths within the device which would severely degrade its operation. The first line 11 is shorted via a path which starts at point C on its inner conductor 11a to point D on the outer conductor 12b of the second line 12 and back to point E on the outer conductor 11 b of the first line 11. Similarly the second line 12 is shorted via a path which starts from point A on the inner conductor 12a of the second line 12 to point B on the inner conductors 11a, 12a of both lines 11, 12 and then back to point C on the outer conductor 12b of the second line 12. The purpose of winding the second line 12 on a magnetic core 10 is to make these short circuit paths inductive. It is clear from FIG. 1b that both short circuit paths pass just once through the inductance provided by the winding whilst the normal TEM propagation mode of the second line 12 remains unaffected. Provided that the impedance of the inductance in the short circuit paths remains large, during an input pulse 13c, in comparison to the impedance of the lines used to construct the transformer, then very little current will pass through the short circuit paths and the output pulse 14c from the transformer will show very little pulse droop or distortion. Good isolation of the output of the transformer from the input can be achieved in this way provided the size of the inductance is large enough. In the case of pulse inversion, pulse isolation and current pulse transformers, inductive isolation is effected in an entirely analogous way and the modelling technique to be described can easily be extrapolated to deal with these variants.

It is readily deduced, by consideration of the 2-stage transformer shown in FIG. 1, that in the case of multi-stage voltage transformers, every line in the structure, apart from the bottom one, must be wound inductively to ensure that all the short circuit paths in the transformers are suppressed. It is not immediately clear, however, whether the same amount of isolation should be used on each line i.e. should the inductance of the windings in the transformer be kept constant at each stage or should it vary from stage to stage or whether there is some benefit in mutually coupling the windings between stages.

The modelling method to be described allows these questions to be resolved such that the design of a given transformer can be optimised to minimise pulse droop and distortion. The basis of the model is to reflect components connected to the output of the transformer and parasitic stray impedances in the secondary circuit to the input of the transformer in an analogous fashion to that performed when modelling a conventional magnetically cored pulse transformer, in which components or impedances are reflected from the secondary circuit to the primary or vice versa by dividing or multiplying their values by a factor of $n^2$, where n is the turns ratio of the transformer. In the case of transmission line transformers of the type described above, the same technique can be used but, in this case, components are reflected by a factor of $n^2$, where in this case, n is the number of stages or transmission lines used to construct the transformer. At first glance, this seems to be a reasonable technique given that the input impedance of the simple two-stage device shown in FIG. 1 is $Z_o/2$ and the output impedance is $2Z_o$ that the ratio of output impedance to input impedance is 4 i.e. $2^2$. However it is not immediately clear how the mutually coupled inductance due to each winding should be analysed or what the effect will be, on pulse distortion, of any stray capacitance in the windings of these transformers.

The most convenient way to understand the theory of the model is by example and this is given here by analysing, in detail, the operation of a simple 3-stage voltage transformer as shown in FIG. 2. It can be seen that the 3-stage transformer comprises a first line 21, a second line 22 and a third line 23 each having an inner and outer conductor as before. At the input 24 to the transformer the lines 21, 22, 23 are connected together in parallel and at the output 25 the lines are connected together in series. The second and third lines 22, 23 are each wound separately around magnetic cores 26, 27 giving rise to windings 26a, 27a. A matched load 28 having an impedance of $3Z_o$, where $Z_o$ is the characteristic impedance of any one of the lines 21, 22, 23 is placed across the output 25 of the transformer. The input impedance of the transformer is $Z_o/3$.

Assuming that a pulse of amplitude V is input to the transformer, examination of the distribution of the potentials, at different points within the structure, reveals that, initially, there is a drop in potential of 2V across both the inner and outer conductors of the third line 23 from output 25 to input 24. Similarly there is a drop in potential of V across both the inner and outer conductors of the second line 22. Based both on this observation and an examination of the way in which the mutual inductance's are connected within the structure of the transformer, an equivalent Laplace circuit may be drawn of the output side of the transformer as given in FIG. 3a. In this diagram each of the transmission lines 21, 22, 23 is represented as a voltage step source 31a, 32a, 33a of amplitude 2V in series with an impedance 31b, 32b, 33b having a value $Z_o$ being the impedance of each of the lines. The mutually coupled inductors 34a, 34b, 35, 36 represent the two windings 26a, 27a in the transformer and are connected such that the potential drop across the windings is correctly represented by reference to FIG. 2. It is assumed that the number of turns on both windings is the same so that the inductance of all four inductors is equal. If it is also assumed that the coupling between both conductors in each of the lines is perfect i.e. M=L, then by mesh analysis or otherwise it is relatively straightforward to derive an expression for the output voltage of the transformer as a function of time which appears across the matched load impedance $3 Z_o$. This voltage is given by:

$$v(t) = 3V \exp-\left\{\frac{5}{6}\frac{Z_o t}{L}\right\}$$

Thus the output will droop exponentially at a rate which depends on both the impedance of the transmission lines and the inductance of the windings. Analysis of the circuit also reveals that the current $i_1$ and $i_2$ are zero, therefore the network of two coupled mutual inductors can effectively be uncoupled from the intermediate connections to the lines by opening switches SW1 and SW2. If the effective inductance $L_x$ represented by the two coupled mutual inductors is then calculated, the circuit can be simplified to that shown in FIG. 3b by combining the voltage step sources 31a, 32a, 33a and the impedances 31b, 32b, 33b into a single voltage step source 38a of magnitude 6V and a single impedance 38b of magnitude $3Z_o$, and by putting a single inductor 39 of magnitude $L_x$ in parallel with the matched load 37 having an impedance of $3Z_o$. By using the reflection technique discussed earlier an equivalent circuit, shown in FIG. 3c, referred to the primary circuit can also be drawn where the impedances 37, 38b and the inductor 39 are reflected by a factor of 32 and shown in FIG. 3c as reflected impedances 37', 38b' and reflected inductor 39'. An ideal transformer 40 with a turns ratio of 3 is also included as a reminder that the output voltage of the transformer will be 3 times the input voltage. Continuing the analysis further reveals that the inductance $L_x$ has a value of 9L/5 where L is the self-inductance of a single conductor of a single winding, and if this value is used to derive an expression for the output voltages as a function of time for either the simplified secondary or primary circuits, an expression results which is identical to equation 1. Furthermore it is also easy to show that the inductor $L_x$ can also be represented as 2 inductors in parallel whose values are 9L and 9L/4 for the secondary circuit or L and L/4 when reflected to the primary circuit. This observation is significant in that the analysis of this type of transmission line voltage transformer can now be greatly simplified by considering only the inductive paths which exist in the transformer from the outer conductors of each of the lines to ground at the output side of the transformer.

Figure 4A:
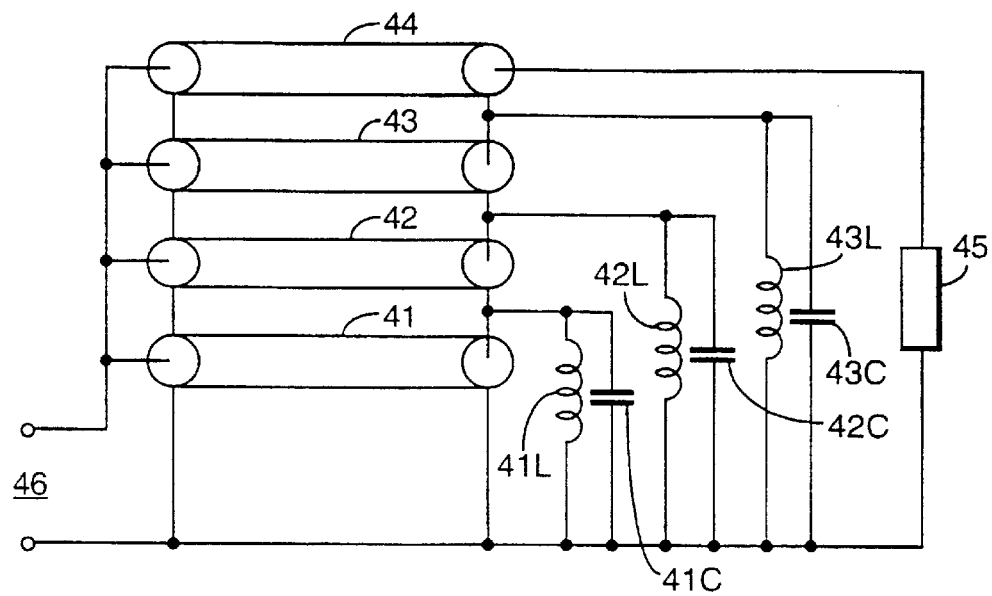
FIG. 4a is a circuit diagram showing an equivalent circuit similar to FIGS. 1b and 3a of a four-stage voltage transformer.
Figure 4B:
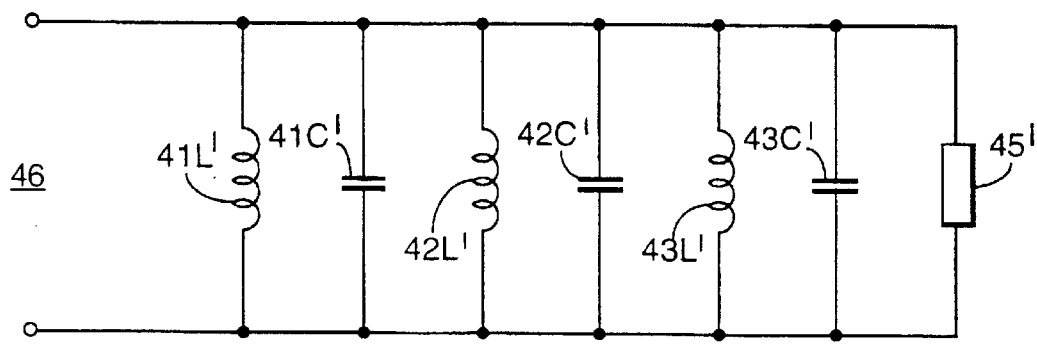

The method can be illustrated by reference to FIGS. 4a, 4b, 4c which represent a 4-stage transformer having a first 41, second 42, third 43 and fourth 44 line connected together in parallel at the input 46 and in series at the output across which a matched load 45 is connected. Ignoring resistive losses and losses in the cores, but including the stray capacitance across each of the windings leads to an equivalent circuit shown in FIG. 4a in which the inductances and stray capacitances associated which the three windings of lines 42, 43 and 44 have been represented as inductors 41L, 42L and 43L each having an inductance L and capacitors 41C, 42C and 43C each having a capacitance C. The inductive paths to ground are placed according to the arguments developed above. If the components on the output side of the transformer are now reflected to the input or primary with $n^2$ factors which are determined by the stage to which each component is connected, an equivalent circuit can be drawn as given in FIG. 4b in which inductor 41L' represents inductor 41L reflected by reflection factor $n^2=1^2$ associated with the first stage of the transformer. Thus reflected inductor 41L'=the unreflected inductor 41L=L. Similarly reflected capacitor 41C'=unreflected capacitor 41C=C. However, inductor 42L and capacitor 42C are reflected using the reflection factor $n^2=2^2=4$ and accordingly reflected inductor 42L'=L/4, while reflected capacitor 42C'=4C. Similarly, inductor 43L and capacitor 43C are reflected using the reflection factor $n^2=3^2=9$ and accordingly reflected inductor 43L'=L/9 and reflected capacitor 43C'=9C.

Figure 4C:
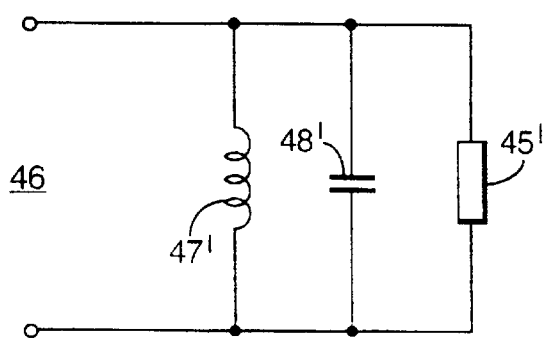
FIG. 4c is a circuit diagram of a further simplified equivalent circuit, referred to the primary circuit of the four-stage voltage transformer of FIGS. 4a and 4b.

This circuit may be further simplified as shown in FIG. 4c by replacing the individual reflected inductors 41L', 42L', 43L' with a single effective reflected inductor 47' having an inductance $L_x$ given by the summed effect of the individual reflected inductors 41L', 42L', 43L'. Similarly, a single effective reflected capacitor 48' having a capacitance $C_x$ may replace the individual reflected capacitors 41C', 42C', 43C'.

Figure 3A:
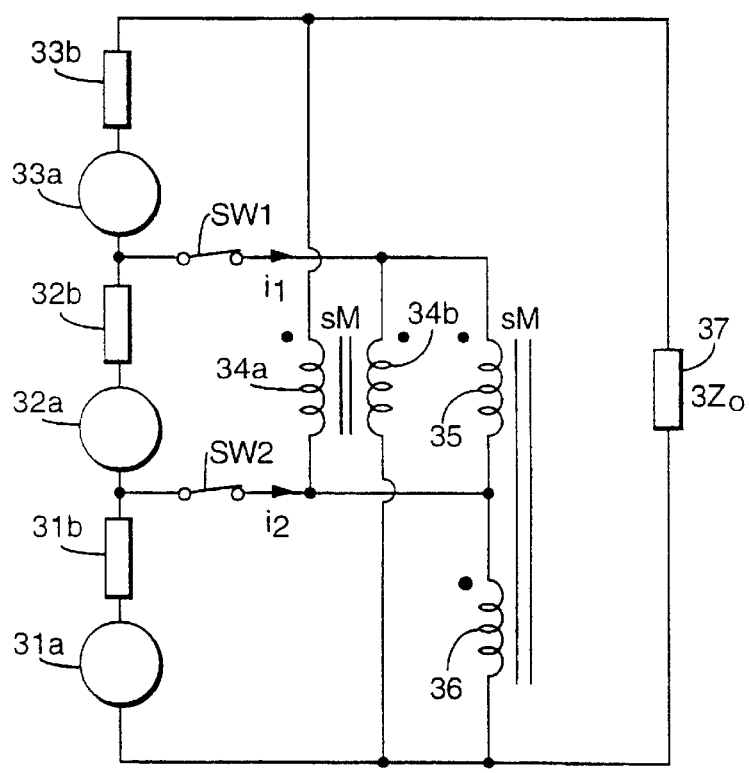
FIG. 3a is a circuit diagram showing an equivalent circuit of the three-stage voltage transformer of FIG. 2.
Figure 3B:
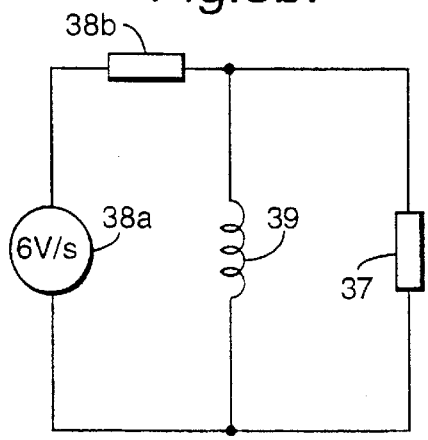
FIG. 3b is a circuit diagram showing a simplified equivalent circuit of the three-stage voltage transformer of FIG. 2, referred to the secondary circuit.
Figure 3C:
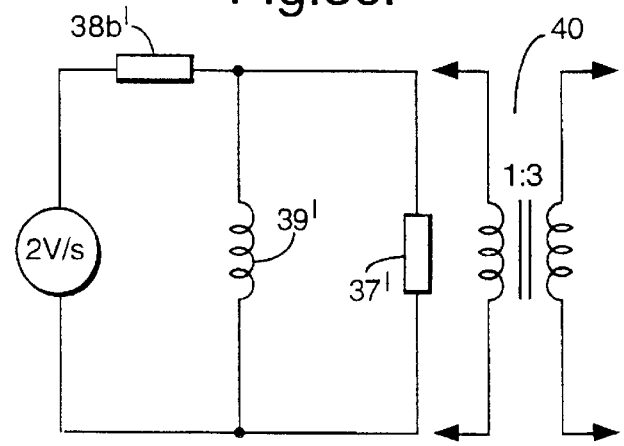
FIG. 3c is a circuit diagram showing a simplified equivalent circuit of the three-stage voltage transformer of FIG. 2, referred to the primary circuit.

This very simple circuit gives exactly the right expression for the output voltage of the transformer as a function of time for any given input as may alternatively be derived by laborious analysis of the 4-stage Laplace equivalent circuit analogous to that shown in FIG. 3a for a 3-stage device.

From this simple model a generalised expression for the output voltage of an n-stage transformer of this type, when driven from a voltage step source of amplitude V, can easily be found to be:

$$v(t) = nV \exp - \frac{[1^2 + 2^2 + 3^2 + \ldots + (n-1)^2]}{2n} \frac{Z_o t}{L} \quad (2)$$

This simple method of modelling and analysing the behaviour of transmission line voltage transformers highlights an important feature of these devices concerning the droop rate of flat-topped input pulses. It can be seen from FIG. 4b that the most serious cause of droop is the inductive path to ground of the inductor 43L connecting the outer conductor of the highest stage in the transformer to ground. It is therefore clear that the inductive isolation required at each stage of the transformer should be increased relative to its nearest lower neighbour, as one progresses up the transformer in order to minimise droop. Similarly it can also be seen that in order to minimise rise-time in such devices it is imperative that the stray capacitance associated with the inductive windings of the top stages of these transformers should be kept as low as possible.

Figure 5A:
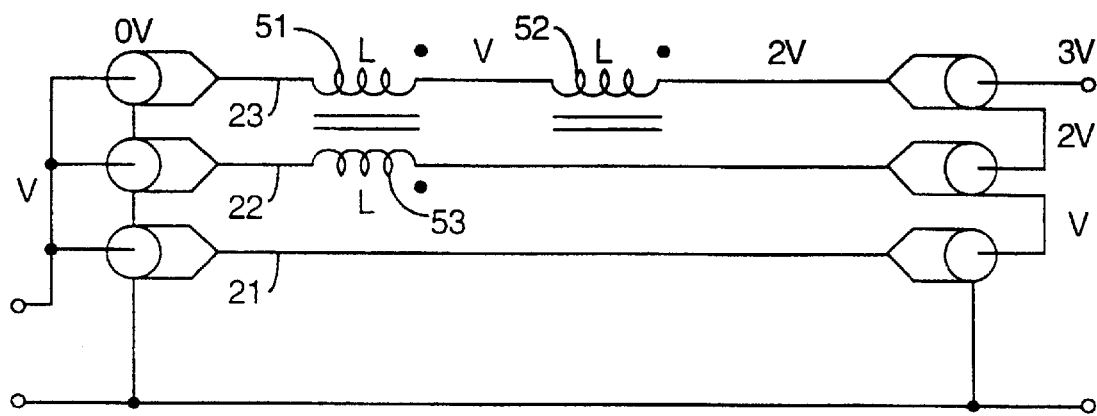
FIG. 5a is a circuit diagram of an equivalent circuit of a mutually coupled three-stage voltage transformer.
Figure 5B:
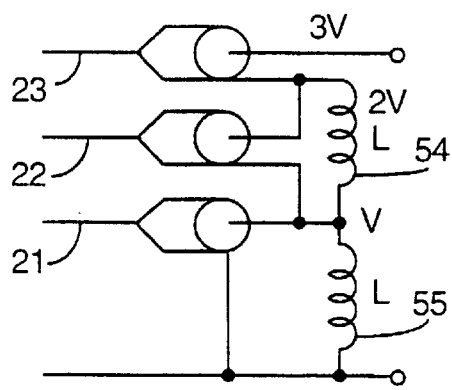
Figure 5C:
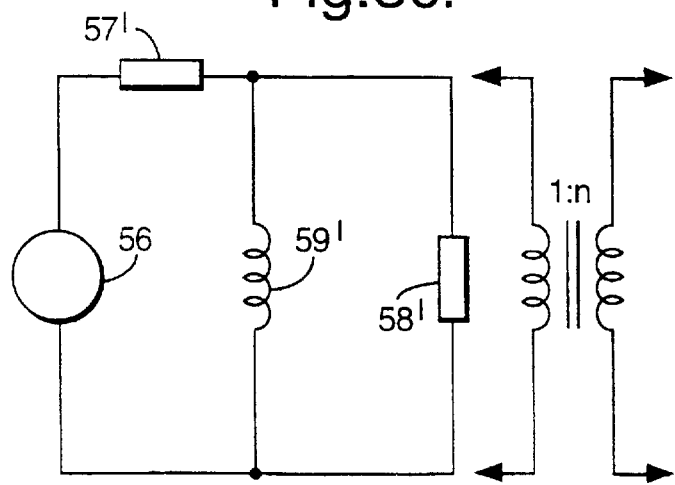
FIG. 5c is a circuit diagram of a simplified equivalent circuit of the circuit shown in FIGS. 5a and 5b, referred to the primary circuit of the transformer.

There are many other winding techniques which can be used to provide inductive isolation between the input and output of such transformers which will present themselves to persons skilled in the art. One such possible winding technique is described below in which mutually coupled windings are utilised; slower droop rates are achieved in this way. For comparison purposes the analysis of the performance of the 3-stage voltage transformer in FIG. 5a is carried out. In this device the top stage now has two windings 51, 56 one of which 51 is mutually coupled to the winding 53 of the second stage. The voltage across the outer conductor of the third line 23 between ground at the input end of the third line 23 and its output voltage at the output end of the third line 23 is divided between the two windings 51, 52 such that the potential between the two windings 51, 52 is half the potential of the outer conductor at the output end of the third line 23. FIG. 5b shows an equivalent circuit of the output end of the transformer of FIG. 5a in which only the inductive routes to ground via the outer conductors of the wound lines 22, 23 are considered and are represented in FIG. 5b by inductors 54, 55. An equivalent circuit may be drawn in a similar way to that used to produce FIG. 3a although, in this case, there are effectively four coupled windings on one core and two on the other. Again analysis shows that the effect of the inductance of the coupled windings can be partly decoupled from the circuit to produce an equivalent inductance ($L_x$) which can be placed in parallel with the load. However in this case the inductance is found to be 9L/2 and consequently the output voltage of this transformer into a matched load when fed from a voltage step source of amplitude V is found to be:

$$v(t) = 3V \exp - \left(\frac{1}{3} \frac{Z_o t}{L}\right) \quad (3)$$

which clearly has a slower droop rate than the 3-stage transformer analysed previously. Furthermore consideration of the distribution of potential throughout the transformer structure as indicated in FIG. 5a together with detailed mesh analysis of the equivalent circuit, suggests again that it is necessary to consider only the effective inductive paths to ground through the outer conductors of the transmission lines. Thus the inductive path to ground, in this transformer, consists solely of 2 inductors 54, 55 connected in series as shown in FIG. 5b. Reflection of these inductors to the primary circuit, as before, then results in a very simple equivalent circuit which makes analysis of the pulse risetime and pulse droop rate response of the transformer a very simple task. This winding technique can be extended in an n-stage device by winding all but the bottom line on one core, winding all but the bottom two lines on the next core and so on until the top line is wound alone on the last core. The equivalent circuit which results from such a winding technique gives rise to the general form for an n-stage transformer shown in FIG. 5c in which the input voltage supply 56 is connected in series with the reflected total impedance of the lines 57' which is equal in magnitude to the characteristic impedance of a single line $Z^o$ divided by the number of stages of the transformer n. Also, connected in series with the input voltage supply 56 and the reflected total impedance of the lines 57' in FIG. 5c, is the reflected load 58' which is equal in magnitude to the impedance of the load divided by $n^2$. Where the load is a matched load it will have an impedance of $nZ_o$ and thus the reflected load 58' will have an impedance of $Z_o/n$. Finally, the total reflected effective inductance 59' of the windings of the transformer is connected in series with the voltage supply 56 and the reflected total impedance of the lines 57' and in parallel with the reflected load 58'. The magnitude of the reflected effective inductance 59' which results from such a winding technique is the inductance of a single coil, L, divided by n−1, where n is the number of stages of the transformer. The general expression for the output voltage across a matched load for an n-stage transformer of this type is:

$$v(t) = nV \exp - \left(\frac{(n-1)}{2n} \frac{Z_o t}{L}\right) \quad (4)$$

The analysis of the transient behaviour of transmission line transformers made from coupled lengths of transmission lines would appear, at first sight, to be a daunting task. It has, however, been shown how to derive very simple equivalent circuits from which the response of such transformers can be easily and accurately analysed. Although in all of the cases analysed, matched conditions have been assumed, i.e. input and output impedances of the transformers are matched to source and load respectively, the model works perfectly well for unmatched conditions. The modelling technique has been carefully checked both by mesh analysis of a variety of different transformers and by measurements on a large number of experimental test transformers constructed from standard 50Ω coaxial cable wound on high frequency ferrite cores. The experimental transformers were all driven from a matched pulse generator and accurate measurements of both pulse rise-time and pulse droop were taken to double check the accuracy of the modelling technique. In all cases it was found that the modelling method could be adapted to a given transformer design and gave completely accurate results. It is important to emphasise though that the model does assume perfect coupling between the two conductors of a transmission line when wound on a core and that resistive and magnetic losses are ignored. Operation of transformers of the type described at frequencies at which the skin effect begins to distort the pulse shape will mean that such losses will also have to be included in the model in order to give accurate predictions of pulse distortion and in particular rise-time response.

Referring to FIGS. 6 to 12, a ten-stage transmission line transformer is described. The properties of this transformer have been investigated—particularly the rise-time, gain and pulse droop capabilities—especially in relation to its performance as a high voltage pulse transformer capable of output voltage of up to 200 kV when operated in air. Rise-time and pulse droop have always been problem issues for designers of conventional magnetically cored pulse transformers, particularly in the case of high voltage transformers with large turns ratios. In such devices leakage inductance in the primary winding and stray capacitance in the secondary can severely limit output rise time if the number of turns on the transformer is restricted in order to reduce the stray capacitance, the primary inductance is reduced and consequently pulse droop becomes worse. The transformer of FIG. 6 features a rise time/pulse droop capability which would be very difficult to achieve in a conventional pulse transformer with the same operating voltage and voltage gain. Furthermore performance measurements on the transformer and their analysis indicate fairly simple ways in which the rise time and pulse droop capabilities could be further extended in this type of device.

The low pulse droop exhibited by the transformer should be of considerable interest, for example, to the designers of linear accelerators which use high power klystrons to accelerate the beam. Pulse droops of less than 1% over pulse lengths up to 1 µs are often specified for the pulsed power source used to drive the klystrons in order to minimise power and phase variations between the accelerating cavities.

Figure 6:
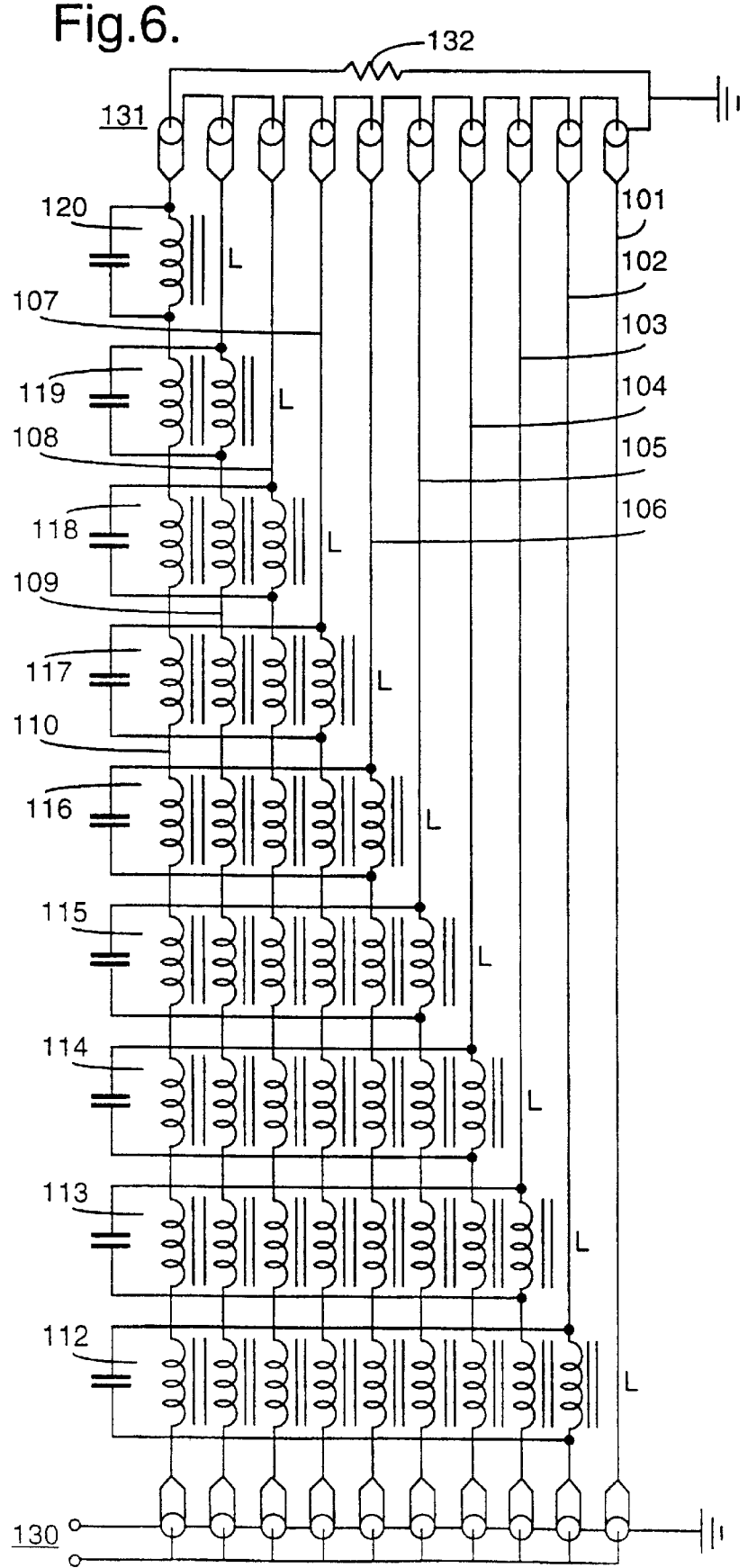
FIG. 6 is a circuit diagram of an equivalent circuit of a ten-stage transformer according to the present invention.
Figure 7A:
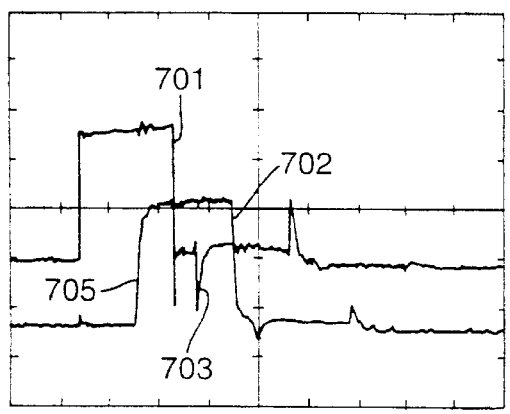
FIG. 7a is a graph of voltage against time (500 nano seconds per horizontal division) showing input and output waveforms to and from the transformer of FIG. 6.
Figure 7B:
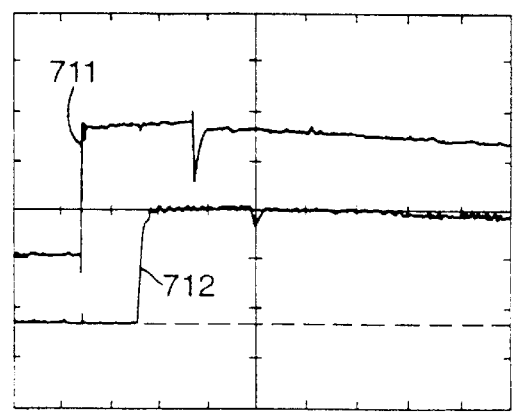
Figure 7C:
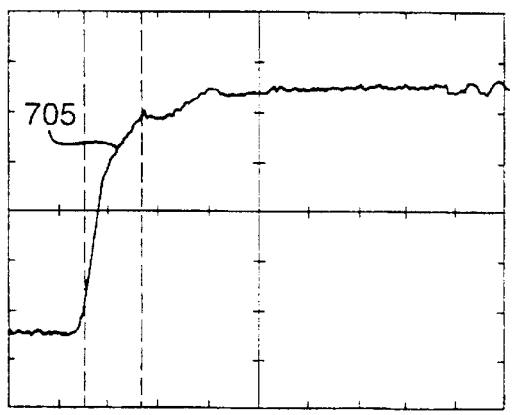
FIG. 7c is similar to FIG. 7a, however the horizontal scale has been replaced with a 50 nano second per horizontal division scale and only the output waveform is shown.
Figure 7D:
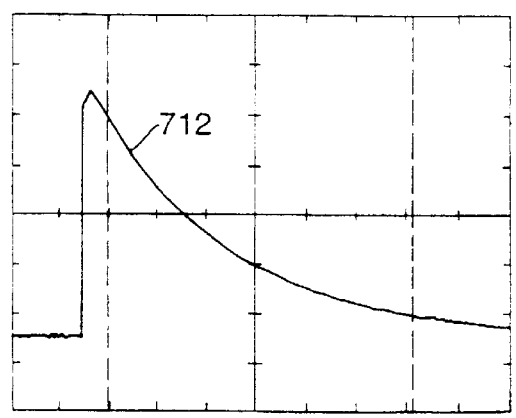
FIG. 7d is similar to FIG. 7b except again only the output waveform is shown and the horizontal scale has been increased from 500 nano seconds per horizontal division to 10 micro seconds.
Figure 9:
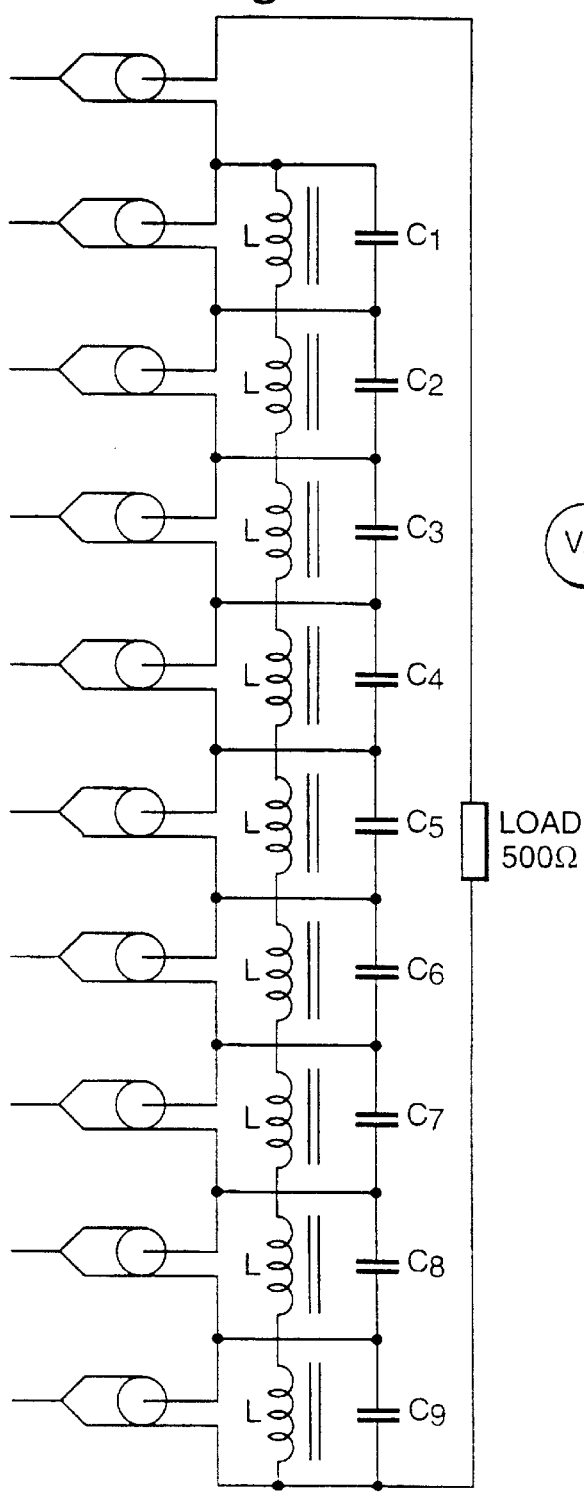
FIG. 9 is a circuit diagram showing an equivalent circuit of the output of the transformer of FIG. 6.
Figure 10:
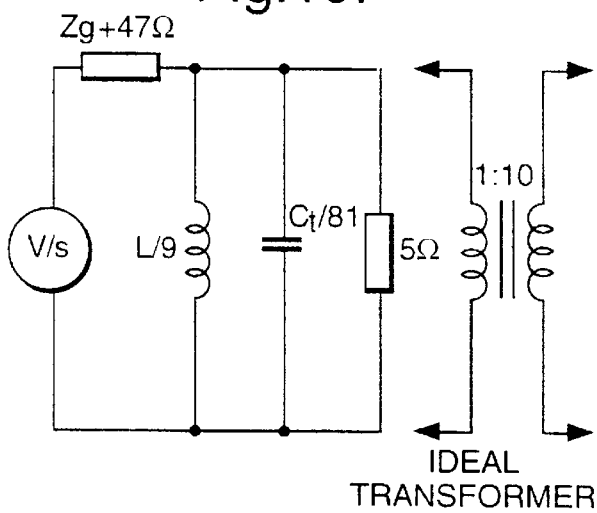
FIG. 10 is a circuit diagram showing an equivalent circuit of the input of the transformer of FIG. 6.
Figure 11:
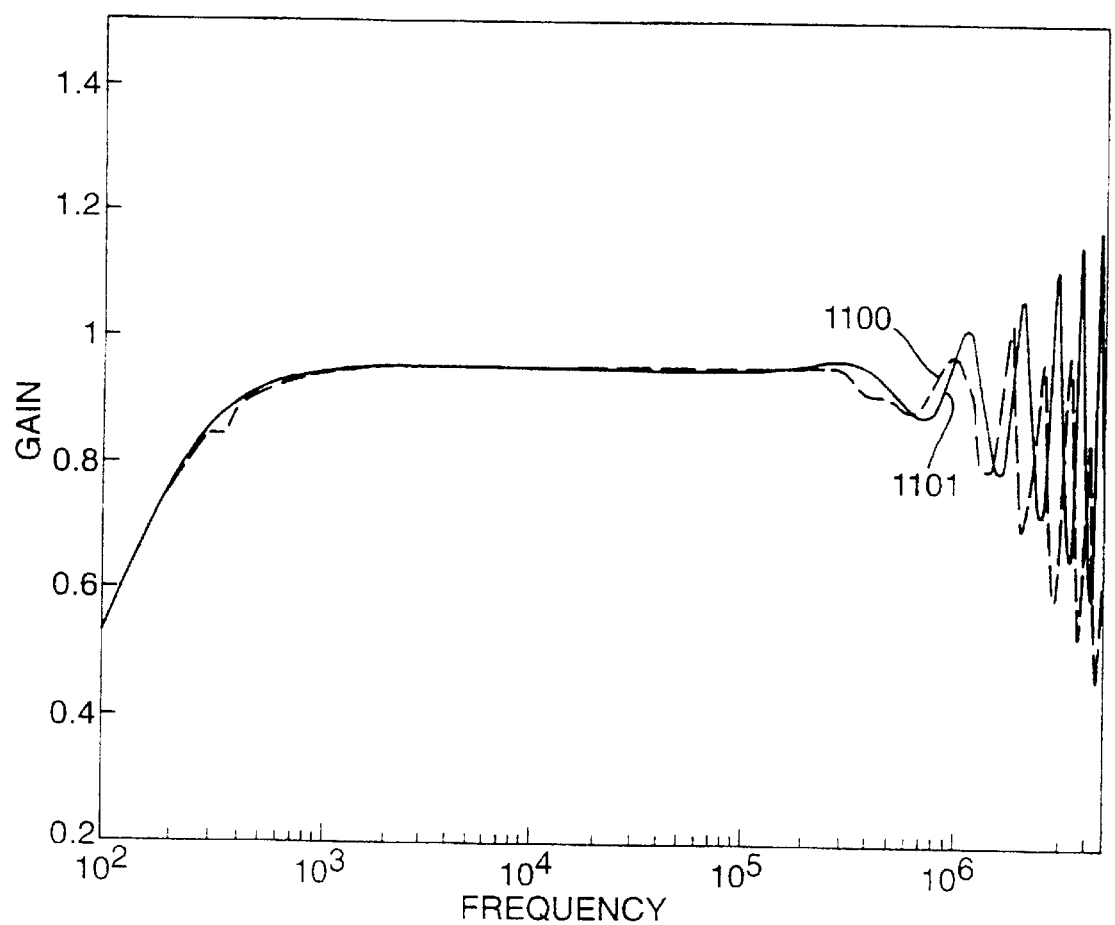
FIG. 11 is a graph of gain against frequency showing the calculated (solid line) and observed (broken line) response curves for the transformer of FIG. 6, the maximum gain for both curves having been normalised.

The basic construction of the transformer can be seen by reference to the circuit diagram shown in FIG. 6. The transformer is constructed using ten lengths 101–110 of URM 67 coaxial cable each of which is 110 m long. This cable has an impedance of 50Ω, an outside diameter of 10.3 mm and a maximum d.c. operating voltage of 40 kV. The basic construction of the transformer exploits the benefits of mutually coupling the cable windings, at each level 112–120 of the transformer (except for the top level 120 where only the top stage cable 110 is wound) to enhance the inductive isolation of the output of the transformer from the input. This winding technique also ensures that the inductive isolation to ground, from the output of the transformer to the input, increases from the bottom stage upwards and has the added benefit that the potential difference between the top and bottom stage of the transformer (and between the top and bottom levels 112–120) is uniformly divided between each of the ten stages of the transformer (and across each of the nine levels of the transformer). The transformer is wound through nine sets of ferrite cores, one set for all but the bottom stage of the transformer. Each set of cores comprises 18 rectangular cores made from 4 clamped 'I' shaped cores and are mounted radially on the circumference of a large PVC tube 40 mm in diameter. The cores are made of 3C8 (A16) MnZn ferrite which is commonly used to make power transformers for switched mode power supplies and the magnetic area of the cores is 625 mm. The magnetic length of the cores is reduced in the top levels of the transformer to minimise its weight and size. This is possible as the volume, occupied by the windings, reduces from the bottom 112 to the top 120 levels of the transformer. Each level of the transformer, with its corresponding set of cores, is separated from its neighbours by an annular ring of perspex which is glued to the PVC tube, to minimise the chance of electrical breakdown between the levels, and the whole winding/core structure is supported with threaded lengths of nylon rod which are bolted at each stage. The overall height of the transformer is 1.3 m.

The transformer is wound by taking nine 102–110 of the cables and winding them, in a spiral fashion, 7 times through the lowest set of ferrite cores, on the PVC tube. The first stage of the transformer is made by passing the tenth cable 101 through a hole in the bottom of the tube and making it the bottom cable 101 in the series connection of the output ends 131 of the cables shown in FIG. 6. The next stage of the transformer is made by winding eight 103–110 of the remaining nine cables again seven times through the next set of 18 cores adjacent to the bottom set. The ninth cable 102 is then passed into the tube and connected in series with the output of the cable 101 forming the first stage of the transformer. This process is repeated at each stage by winding all but one of the remaining cables on separate sets of cores and connecting the unwound cable in series with the output of the preceding stage. In this way the top level comprises just one cable 110 which, when connected in series with the penultimate cable 109 in the stack, completes the construction and winding of the transformer. The series connection of the output ends of the cables is made vertically, up the centre of the PVC tube on which the windings are mounted. As only one of the cables 110 is wound through all nine sets of cores there is the problem of storing quite large lengths of cable. This is done by winding the cables, prior to winding the transformer, on a second PVC tube. Clearly the longest winding on this tube results from the bottom cable 101 of the transformer with successive cables 102–110 in the transformer occupying a decreasing amount of space on the second tube as their winding length in the transformer stack increases.

A load resistor 132 is connected to the output 131 of the transformer by running the load and its connecting conductors down the centre of the transformer in parallel with the insulating rod used to support the vertical series connection of the output of the cables. A low inductance connection to the input 130 of the transformer may be made by stripping back the braiding of the cables by 100 mm and soldering the inner conductors of the cables to a length of brass sheet. The braiding of each of the cables is then connected to a second brass sheet which is run under the set of inner conductors and insulated from them by a sheet of perspex.

The transformer may be operated in air so that modifications to the transformer structure and electrical measurements on the transformer can conveniently be made. This means that the maximum operating voltage of the transformer is restricted to 200 kV due to electrical breakdown problems within the transformer structure when operated above this voltage. There is no reason why the transformer could not be operated under oil when it should be possible to approach an operating potential close to 10 times the maximum operating potential of an individual cable. It should be noted however that internal breakdown of individual cables, due to corona discharges between the cable conductors and the insulating dielectric, will reduce this operating potential to a figure below the maximum d.c. operating potential quoted earlier. This problem is exacerbated if such transformers are run at high repetition rates. Performance data from the manufacturer of URM 67 cable recommends a maximum pulse operating voltage of 13 kV although experience in operating this and other transmission line transformers would suggest that this figure is rather conservative and that the cable can safely be run at around twice this voltage.

The operating characteristics of the transformer as a pulse transformer were investigated both at low voltage and at the maximum voltage that the transformer would withstand without breakdown (200 kV). At low voltage a pulse generator, with pulse rise and fall times ≦6 ns (Philips PM5715), was connected to the input 130 of the transformer via a 47Ω resistor to ensure that the 50Ω output impedance of the generator was matched. Since the input impedance of the transformer is just 5Ω care was taken to minimise the stray inductance of the connection to prevent an increase in pulse rise-time. The output 131 of the transformer was connected to a carbon composite 500Ω load resistor as described above. Observation of both the input and output waveforms was made using a Tektronix 2440 oscilloscope. The results of these tests are shown in FIGS. 7(*a*), 7(*b*), 7(*c*) and 7(*d*), in which the horizontal axes represent time and each horizontal division corresponds to a duration of 500 ns, 500 ns, 50 ns and 10 μs respectively.

In FIG. 7(*a*) input and output waveforms are shown for a 1 μs input pulse 701, the output pulse 702 being the lower of the two waveforms. The output pulse waveform 702, scaled down in FIG. 7(*a*) by a factor of 10 compared to the input pulse 701, shows negligible droop and some increase in rise-time due to the stray capacitance in the spiral cable windings of the transformer. This capacitance causes a mismatch to the output impedance of the transformer at the start of the pulse and consequently a negative spike 703 is propagated back to the input 130 of the transformer. This spike 703 can clearly be seen on the input wave form after the input pulse 701 has terminated. The amplitudes of the input 701 and the scaled down output 702 pulses are virtually the same, when the transformer is operated under matched conditions, indicating that the gain of the transformer is very close the theoretical gain of 10. The leading edge 705 of the output wave form is expanded and displayed in FIG. 7(*c*) where it can be seen that the 10 to 90% rise-time is of the order of 65 ns if the spurious "bump" on the rising edge of the wave form is disregarded. A longer, 100 μs pulse 711 was also injected into the transformer to investigate its ability to maintain "fat-top" performance over relatively long time scales and the results of this investigation are shown in FIGS. 7(*b*) and 7(*d*). In FIG. 7(*b*) very little droop is evident in the output pulse 712 over a duration of several μs and in FIG. 7(*d*) the 90 to 10% droop, on a much longer time-scale, can be seen to be 61.9 μs.

At high voltages, the low input impedance of the pulse transformer makes it difficult to produce a pulse of sufficient quality to adequately test the performance capabilities of the transformer. This problem was solved by building a 1 μs pulse forming line using ten parallel lengths of URM 67 coaxial cable which gives a perfect match to the input impedance of the transformer. To minimise pulse distortion a pressurised rail spark gap was used to switch the pulse forming line into the transformer through a carefully engineered, low inductance feed. To inject a pulse 801 of 20 kV into the transformer the line was charged to 40 kV and the results of this test are shown in FIG. 8. The output voltage wave form 802 (the size of which has again been scaled down by a factor of 10) has a slight increase in rise-time with negligible droop and has an amplitude which is very close to the theoretical maximum of 200 kV. Clearly the performance of this transformer as a high voltage pulse transformer is exceptional in comparison to the level of performance that is to be expected from conventional magnetic core devices.

Both the observed rise time and droop can accurately be accounted for using the reflection model for this type of transformer discussed above in relation to FIGS. 1 to 5. Equivalent circuits for both the output and input circuits of the transformer can be found by this method and the resulting circuits are presented in FIGS. 9 and 10. In the output circuit (shown in FIG. 9) it has been assumed that the inductance of the windings at each level of the transformer is the same despite the fact that the magnetic length of the cores in the top two and bottom two levels of the transformer are slightly smaller and larger, respectively, than the length of the remaining middle levels. The variation in the measured inductance at the different levels ranged from 1.9 mH (top) to 1.26 mH (bottom). The effect of this variation was minimised by estimating, from the measured values, an average value of the inductance L per level of 1.35 mH which is used in the performance calculations. An estimate of the stray capacitance across the spiral windings, at each level of the transformer, was obtained by isolating the top stage of the transformer and measuring its self-resonant frequency. This was done by connecting a signal generator to both ends of outer conductor of the cable 110 that forms the top winding. From the measured inductance of this winding and the self-resonant frequency, it was possible to calculate a value for its stray capacitance ($C_1$) of 130 pF. The stray capacitance of the remaining windings ($C_2$ to $C_9$) was estimated by multiplying this value by the number of cables in a given winding and adding to the resulting figure an additional estimated capacitance to allow for stray capacitance between windings. The total stray secondary capacitance, across the output of the transformer $C_t$, was then calculated as the series combination of the stray capacitance's of all nine windings giving a value of 70 pF. Reflecting both the total stage inductance and total stray capacitance to the input circuit gives a very simple circuit (FIG. 10) from which approximate values of both rise time and fall time can be calculated and compared to the experimental values. This analysis leads-to the following expressions:

$$v_o(t) = V \frac{5}{Z+5} \exp\left(-\frac{45Zt}{L(Z+5)}\right) \quad \text{(fall time)} \tag{5}$$

$$v_o(t) = V \frac{5}{Z+5}\left(1 - \exp\left(-\frac{(Z+5)t}{405ZC}\right)\right) \quad \text{(rise time)} \tag{6}$$

where Z is the sum of the output impedance of the generator and the value of the matching resistor (97Ω). L is the average level inductance and $C_t$ is the total stray capacitance. Using the values of L and $C_t$ given above gives calculated values for the 10 to 90% rise and fall times of 59 ns and 69 μs respectively. These times are in close agreement to the observed values.

As a further evaluation of the performance capabilities of the transformer the frequency dependence of the voltage gain of the transformer was measured from very low frequencies to 5 MHz. These measurements were again taken under matched conditions (i.e. a sinusoidal signal generator was matched to the input of the transformer with a series 47Ω resistor and the output was connected to a 500Ω load) and the results, which are normalised to a maximum gain of 10, are shown as the dotted line 1100 in FIG. 11. The resulting frequency response curve is quite similar to that which is obtained for conventional transformers with the exception that the frequency response curve is shifted at both the low and high frequency cut-off points to higher frequencies. As the frequency is increased the transformer reaches full gain at a frequency of approximately 1 kHz and it maintains full gain to a frequency of 300 kHz at which point the gain starts to fall and be modulated by what appears to be an oscillatory response characteristic.

Figure 12:
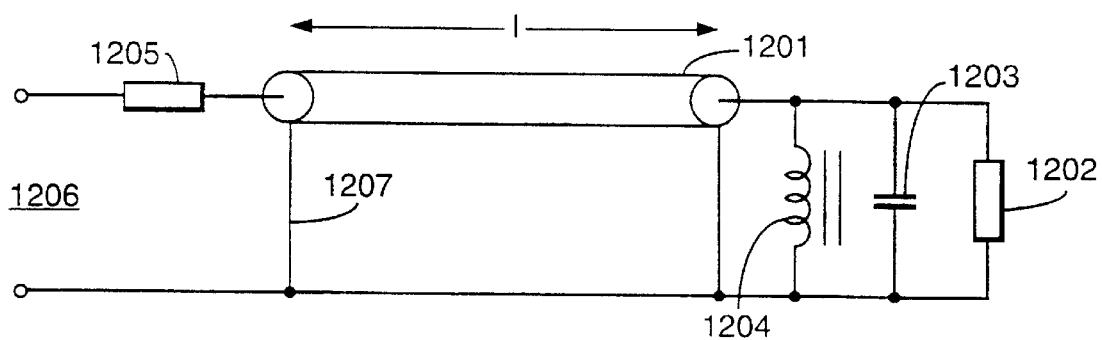
FIG. 12 is a circuit diagram showing an equivalent circuit of the transformer of FIG. 6 suitable for determining the transformer's frequency response.

The shape of the gain v. frequency response curve can be quite accurately accounted for using the simple equivalent circuit of the output side of the transmission line transformer and load given in FIG. 12. In this circuit the transformer is represented as a single 500Ω transmission line 1201 which is terminated by a matched 500Ω load 1202 in parallel with the total stray capacitance of the spiral windings 1203 and an inductance 1204 equal to the sum of the level inductance's as estimated above. The effect of the D.C. resistance of the lines is included in the circuit by adding a resistor 1205 in series with the input 1206 whose value (12Ω) is equal to ten times the measured D.C. resistance of the inner and outer conductors of an individual, 110 m length, of line.

Starting from the standard matrix relationship which connect the input (i) and output M) currents and voltages of a length of transmission line with length I and propagation constant γ:

$$\begin{pmatrix} V_i \\ I_i \end{pmatrix} = \begin{pmatrix} \cosh\gamma l & Z_o \sinh\gamma l \\ Z_o^{-1} \sinh\gamma l & \cosh\gamma l \end{pmatrix} \begin{pmatrix} V_T \\ I_T \end{pmatrix} \quad (7)$$

the voltage transfer function of the equivalent circuit of the transformer and load as a function of complex frequency can be derived. Referring to FIG. 12, the voltage transfer function from the input of the line 1207 (to the right of resistor 1205 having resistance $R_{dc}$ to the load 1202 is given by:

$$\frac{v_o(s)}{v_i(s)} = T(s) = \frac{Z(s)}{Z_o \sinh\gamma l + Z(s) \cosh\gamma l} \quad (8)$$

where Z(s) is the impedance of the parallel combination of the total stray capacitance 1205, the sum of the inductance's 1204 and the resistance of the load 1202. If the input current to the line is $i_j(s)$, then the complete voltage transfer function from the input of the transformer 1206 (to the left of resistor 1205) to the output is given by:

$$\frac{v_o(s)}{v_i(s)} = T(s) = \frac{1}{\frac{R_{dc} i_i(s)}{v_o(s)} + \frac{1}{T'(s)}} \quad (9)$$

From equation (7), the input current $i_j(s)$ can be eliminated using the derived relationship:

$$\frac{i_i(s)}{v_o(s)} = \frac{\sinh\gamma l}{Z_o} + \frac{\cosh\gamma l}{Z(s)} \quad (10)$$

Due to the skin effect the propagation constant of the cables γ will depend through the attenuation constant a and phase constant β on frequency. The frequency dependence of a was calculated from the physical dimensions of URM 67 cable to take the form:

$$\alpha = 4.971 \times 10^{-7} \sqrt{f} \, m^{-1},$$

where f is the frequency. A value for the phase constant β was derived using the inductance and capacitance per meter of the cable. The magnitude of the transfer function T(jω) (equation (9)) was plotted from equations (8) to (10) using MATLAB in order to obtain a theoretical, normalised, frequency response curve for the transformer (shown as the solid line 1101 in FIG. 11) based on the equivalent circuit of FIG. 12. The curve 1101 shows a remarkably good agreement to the experimental curve 1100 of FIG. 11 with the oscillatory fall in response at high frequencies taking a very similar form. Under closer examination it is found that there is a phase shift as well as sharper reduction in amplitude in the oscillations in the experimental curve, although the overall form and frequency of the oscillations is similar. The discrepancies in both the phase and amplitude of the oscillations is probably caused by neglecting both the effect of the stray inductance in the output connections to the transformer and the frequency dependance of the permeability and loss of the ferrite cores, used to build the transformer, in the model. Examination of the voltage transfer function above reveals that the oscillations are caused by the increasingly bad mismatch, as the frequency is increased, between the output impedance of the transformer and the load due to the decreasing impedance presented by the parallel stray winding capacitance. This mismatch results in reflections, at the load, whose amplitude increases with frequency and lead to an apparent oscillatory modulation of the frequency response curve.

The performance of the transformer as a pulse transformer exceeds anything which could be achieved for any conventional magnetically cored device with similar voltage rating and gain or turns ratio that the inventors are aware of. It is also clear from the modelling discussed that both the use time performance and droop of this type of device could be further enhanced. A reduction in the stray capacitance of the cable windings would improve its band-width and rise time and a further increase in inductance by increasing the number of cores or turns in the windings would improve the droop. An important aspect of this invention is that the frequency response characteristics of the transformer indicate that this type of transformer is capable of operating as a continuously excited power transformer whose bandwidth capabilities, particularly at high frequencies, will offer substantial improvements on the performance capabilities of conventional transformers wound on magnetic cores.

Figure 13:
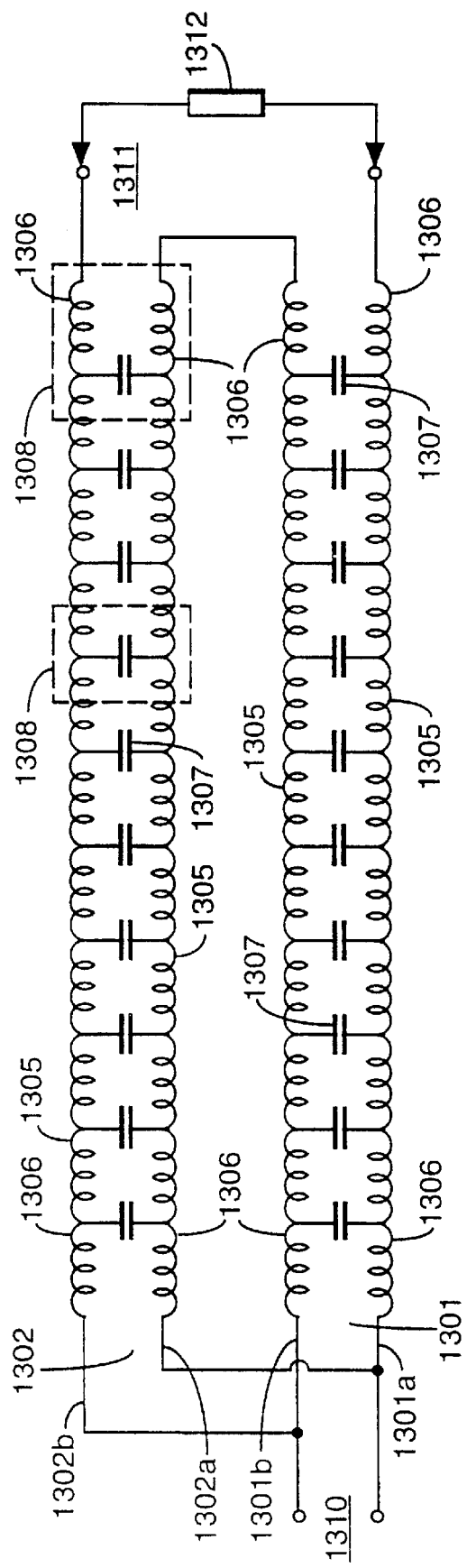
FIG. 13 is a circuit diagram of a further embodiment of the present invention in which lumped element, balanced delay lines are utilised.

Referring now to FIG. 13, there is shown a lumped element, balanced delay line transformer. Each balanced delay line 1301, 1302 comprises a first 1301a, 1302a and a second 1301b, 1302b conductor, each conductor comprising a number of central inductors 1305 each having an inductance L and a pair of outer inductors 1306 at both ends of the conductor having an inductance of L/2. Capacitors 1307, each having a capacitance C are connected between the first and second conductors of each delay line, the capacitors being connected to the conductors between the inductors 1305, 1306 so as to form LC sections 1308 of equal capacitance and inductance. The delay lines 1301 and 1302 are connected together in parallel at the input 1310 giving rise to an input impedance of $Z_o/2$ where $Z_o$ is the characteristic impedance of a single delay line, and are connected together in series at the output 1311 giving rise to an output impedance of $2Z_o$ so as to provide a matched load at the output of the transformer, a load 1312 having an impedance of $2Z_o$ is placed across the output 1311 to the transformer.

Each balanced delay line corresponds to a stage of the transformer in an entirely analogous way to that of the transmission line transformer described above. However, in this case the bulk of transmission lines may in certain circumstances be dispensed with and a much more compact arrangement may then be provided.

An important feature of the transformer shown in FIG. 13 is that both conductors 1301a, 1301b; 1302a, 1302b of each delay line 1301, 1302 have an approximately equal inductance (it is in this sense that they are termed balanced delay lines). This is contrary to most conventional lumped element delay line construction but is essential to provide the necessary isolation between the input and output of the transformer. The ends of both of the balanced delay lines preferably have inductors 1306 whose inductance, L/2, is half that of the inductance, L, of the inductors 1305 used in the middle of the lines. This is desirable, but not essential, to ensure that the lines are symmetrical (lengthwise) and still contain an "equal" number of inductors and capacitors in each line such that the total impedance of each line is given by $$Z_o = \sqrt{(2L/C)}.$$

The advantage in using lumped element, balanced delay lines, is that a low characteristic impedance of each delay line may be formed while keeping a high value of inductance in each LC section 1308. This enhances the low frequency response of the transformer. In order to prevent a reduction in the high frequency response of the transformer, the number of LC sections should be large. In the example shown in FIG. 13 there are ten LC sections. If it was desired to increase the high frequency response of the transformer the number of LC sections should be increased without increasing the overall capacitance and inductance of each delay line, and maintaining the ratio between the overall capacitance and inductance so as to maintain the characteristic impedance $Z_o$ of the delay line. The inductors shown in FIG. 13 are preferably but not necessarily wound on magnetic cores and the capacitors are standard.

When designing the transformer according to the circuit of FIG. 13, it is important to ensure that the delay through each line ($t_d = n\sqrt{LC}$, where n=the number of LC sections) is as long as possible and that the characteristic impedance of the line $$\left( Z_o = \sqrt{\frac{2L}{C}} \right)$$

is low. This has the effect of shifting the frequency response to lower frequencies. Clearly, in order to reduce the characteristic impedance $Z_o$ of each delay line one may either increase the capacitance of the delay line or reduce its inductance. However, reducing the delay line's inductance will also have the negative effect of reducing the inductive isolation between the input and output of the transformer. In fact, it can be shown that in practise the effect of reducing the delay line's impedance is equivalent to increasing the inductive isolation between the input and output of the transformer, since the low frequency response of the transformer depends on the ratio of the inductive isolation of the transformer to the characteristic impedance of the delay lines used.

What is claimed is:

1. A transformer comprising a plurality of transmission or delay lines so arranged as to provide an input to, and an output from the transformer, wherein isolation between the input and output is achieved principally by way of inductive impedance wherein the isolation between the input and the output of the transformer is enhanced by mutual inductive impedance between the lines.

2. A transformer as claimed in claim 1 further comprising capacitance reducing means for reducing stray capacitance between the lines.

3. A transformer as claimed in claim 2 wherein the capacitance reducing means comprises a substantially air filled material located between coils of adjacent or nearly adjacent transmission or delay lines.

4. A transformer as claimed in claim 1 wherein the transmission or delay lines comprise balanced delay lines.

5. A transformer as claimed in claim 4 wherein each delay line comprises a lumped element delay line comprising one or more LC sections.

6. A transformer as claimed in claim 5 wherein each delay line comprises at least 10 LC sections, each LC section having a relatively low impedance and capacitance compared with the total inductance and capacitance of the respective delay line.

7. A transformer comprising a plurality of transmission or delay lines so arranged as to provide an input to, and an output from the transformer, wherein isolation between the input and output is achieved principally by way of inductive impedance wherein the transmission or delay lines comprise continuous transmission lines which have slow signal transmission characteristics.

8. A transformer comprising a plurality of transmission or delay lines so arranged as to provide an input to, and an output from the transformer, wherein isolation between the input and output is achieved principally by way of inductive impedance wherein the transmission or delay lines are arranged so as to provide at least a lower stage and a higher stage, each stage of the transformer being formed from one of the lines and each line comprising a first and a second conductor.

9. A transformer as claimed in claim 8 wherein the first and second conductors of the lines are connected together in parallel at an input end of the lines to form the input to the transformer and wherein the first and second conductors of the lines are connected together in series at an output end of the lines to form the output to the transformer.

10. A transformer as claimed in claim 8 in which the inductive isolation between the input and the output of the transformer is greatest at the higher stage of the transformer.

11. A transformer as claimed in claim 8 in which the inductive isolation between the input and output of the transformer is increased at each stage of the transformer relative to each stage's nearest lower neighbour.

12. A transformer comprising a plurality of transmission or delay lines so arranged as to provide an input to, and an output from the transformer, wherein isolation between the input and output is achieved principally by way of inductive impedance further comprising means for reducing the transfer of energy between actual and parasitic lines in the transformer.

* * * * *